United States Patent
Smolanoff et al.

[11] Patent Number: 6,117,279
[45] Date of Patent: Sep. 12, 2000

[54] METHOD AND APPARATUS FOR INCREASING THE METAL ION FRACTION IN IONIZED PHYSICAL VAPOR DEPOSITION

[75] Inventors: Jason Smolanoff, Jefferson Valley, N.Y.; Doug Caldwell, McKinney, Tex.; Jim Zibrida, Glendale, Ariz.; Bruce Gittleman, Gilbert, Ariz.; Thomas J. Licata, St. Mesa, Ariz.

[73] Assignee: Tokyo Electron Limited, Tokyo, Japan

[21] Appl. No.: 09/190,515

[22] Filed: Nov. 12, 1998

[51] Int. Cl.[7] ................................................. D06F 29/00
[52] U.S. Cl. .............................. 204/192.12; 204/298.06; 204/298.08; 204/298.11
[58] Field of Search .................... 204/298.08, 298.11, 204/298.06, 192.12

[56] References Cited

U.S. PATENT DOCUMENTS

| | | | |
|---|---|---|---|
| 5,556,501 | 9/1996 | Collins et al. | 204/298.34 |
| 5,665,167 | 9/1997 | Deguchi et al. | 315/111.21 |
| 5,800,688 | 9/1998 | Lantsman et al. | 204/298.06 |

FOREIGN PATENT DOCUMENTS 0 801 413 A1   10/1997   European Pat. Off. ......... H01J 37/32

OTHER PUBLICATIONS

European Patent Office, *PCT Search Report*, PCT Application No. PCT/IB99/01764.

*Primary Examiner*—Nam Nguyen
*Assistant Examiner*—Steven H. VerSteeg
*Attorney, Agent, or Firm*—Wood, Herron & Evans, L.L.P.

[57] ABSTRACT

An ionized physical vapor deposition method and apparatus are provided which employs a magnetron magnetic field produced by cathode magnet structure behind a sputtering target to produce a main sputtering plasma, and an RF inductively coupled field produced by an RF coil outside of and surrounding the vacuum of the chamber to produce a secondary plasma in the chamber between the target and a substrate to ionize sputtered material passing from the target to the substrate so that the sputtered material can be electrically or magnetically steered to arrive at the substrate at right angles. A circumferentially interrupted shield or shield structure in the chamber protects the window from material deposits. A low pass LC filter circuit allows the shield to float relative to the RF voltage but to dissipate DC potential on the shield. Advantages provided are that loss of electrons and ions from the secondary plasma is prevented, preserving plasma density and providing high ionization fraction of the sputtered material arriving at the substrate.

14 Claims, 2 Drawing Sheets

METHOD AND APPARATUS FOR INCREASING THE METAL ION FRACTION IN IONIZED PHYSICAL VAPOR DEPOSITION

This invention relates to sputter coating, and more particularly, to the Ionized Physical Vapor Deposition (IPVD) of coating material onto substrates.

BACKGROUND OF THE INVENTION

Smaller and higher aspect ratio features, such as vias, trenches and contact holes, in semiconductor manufacturing impose greater requirements on semiconductor processing equipment. For example, coating contacts on the bottoms of such features with liners and filling the features with conductive films using certain preferred physical vapor deposition (PVD) processes requires the achievement of a high degree of directionality in movement of the material being deposited toward the substrate. Smaller and higher aspect ratio features require greater directionality. To effectively coat contacts, for example, on the bottoms of narrow high aspect ratio holes on the surface of a substrate, it is necessary for the particles of coating material to move at angles to the normal that are not substantially larger than the angular openings of the features. Otherwise, excessive deposits on the upper sides of the features or a closing of the mouth of a feature will result.

A sputter coating process is typically carried out by placing a substrate and a target of high purity coating material into a vacuum chamber filled with an inert gas such as argon or a reactive gas such as nitrogen and creating a plasma in the gas. The plasma is typically generated by maintaining the target, either constantly or intermittently, at a negative potential, so that the target functions as a cathode to supply electrons that excite the gas in the chamber and form a plasma adjacent to the target surface. The plasma generation is usually enhanced with a magnetron cathode assembly in which magnets behind the target trap electrons at high density over the surface of the target where they collide with atoms of the process gas, stripping electrons from atoms of gas to produce positive ions. The gas ions accelerate toward the target, which is negatively biased, to collide with the target surface and eject from the target surface atoms and atomic clusters or particles of target material, as well as secondary electrons, which play a role in sustaining the plasma.

In conventional sputter coating, the large majority of the ejected atoms of target material are neutral in charge and propagate through the vacuum space in various directions with some striking the substrate, to which they adhere to form a film. The directions of travel of the ejected particles from the target surface follow a somewhat broad statistical distribution of angles to the target surface. Various schemes have been used to cause the propagating particles to move in straighter lines toward and normal to the substrate surface. In Ionized Physical Vapor Deposition or IPVD, coating material is sputtered from a target using magnetron sputtering, other conventional sputtering or evaporation techniques, and then the directionality of the particles is improved by ionizing the particles so that they can be electrostatically accelerated or otherwise electrically steered in a direction toward and normal to the substrate.

In IPVD, additional or secondary plasma is created in the space within the chamber between the target or source of the material and the substrate. The particles of sputtered material passing through this space collide with electrons or metastable neutrals of the ionized process gas, which tend to strip electrons from the atoms of the sputtered particles leaving the particles positively charged. Those positive ions of sputtered material that are positively charged are capable of being electrically accelerated toward the substrate, for example, by application of a negative bias to the substrate. The effectiveness of the IPVD process in normalizing the direction of coating particles at the substrate is proportional to the fraction of ionization of the sputtered material produced by the secondary plasma.

Obtaining a high ion fraction of sputtered material requires the secondary plasma to have a high electron density. Loss of electrons from the secondary plasma into the main plasma at the target, or into chamber structure such as walls or shields, can cause a substantial reduction in the effectiveness of the secondary plasma to ionize sputtered material and can result in the extinguishing of the secondary plasma. It is important to minimize the depletion of electrons from the secondary plasma and to otherwise produce a high ionization fraction of sputtered material in IPVD processing.

In addition, structure such as walls or shields that bound a secondary plasma is in direct contact with the secondary plasma in a region called the sheath. The sheath width depends in part on the potential difference between the secondary plasma and this structure. Where the structure is electrically grounded, the typical sheath width is a few electron Debye lengths of about 0.14 mm, for example, where the electron density and temperature are about $10^{10}$ $cm^{-3}$ and 4 volts, respectively. However, if a negative DC potential is allowed to exist on this structure, it has the effect of attracting positive ions from the plasma due to an increase in the width of the plasma sheath, which thereby reduces the effectiveness of the plasma in producing a high ion fraction of the sputtered material. Where it is necessary to facilitate the coupling of energy into the secondary plasma, such as from a peripheral coil to form an inductively coupled plasma, the plasma surrounding shields and other structure are electrically floating, which increases the tendency for electrons, which have a higher velocity than the positive ions in the plasma, to build up a negative DC charge on the shield or other structure. This causes the plasma sheath to encroach into the space desired for the secondary plasma.

Accordingly, there is a need for an IPVD apparatus and method that will provide a high ionization fraction of sputtered material, and particularly that will minimize the loss of electrons from the plasma that is provided for sputtered material ionization. Further, there is a need for an IPVD apparatus and method that will provide a high ionization fraction of sputtered material, particularly by avoiding an extension of the plasma sheath that surrounds the plasma provided for sputtered material ionization into the space of the secondary plasma.

SUMMARY OF THE INVENTION

A primary objective of the present invention is to provide a method and apparatus by which a high ionization fraction of sputtered material is achieved in ionized physical vapor deposition. A particular objective of the present invention is to provide such a method and apparatus in which the loss of charged particles from a plasma that is provided for coating material ionization is minimized or reduced.

A further objective of the present invention is to provide an ionized physical vapor deposition apparatus and method in which the components are configured and operated to prevent adverse affects on electro-magnetic fields within the region occupied by the plasma provided to ionize the coating material.

A further objective of the present invention is to provide a method and apparatus for ionized physical vapor deposition that utilizes a magnetron magnetic field source to provide a main plasma for sputtering coating material efficiently from a sputtering target and that employs a secondary plasma by which is produced a high ionization fraction of the material sputtered from the target. A more particular objective of the present invention is to provide such a method and apparatus in which the loss of charged particles from the secondary plasma is minimized or reduced.

A still further specific objective of the present invention is to provide an ionized physical vapor deposition method and apparatus with walls, shields or other structure that physically bound the secondary plasma that will reduce the diversion of positive ions from the secondary plasma. A more specific objective of the present invention is to provide an ionized physical vapor deposition apparatus and method in which a secondary plasma bounding shield or other structure resists the build-up of negative potential thereon or the diversion of positive ions from the plasma without interfering with the coupling of energy into the plasma.

The present invention is predicated at least in part upon a principle that substantial loss of charged particles from a secondary plasma and a resulting reduction in the ionization fraction of sputtered material by the plasma, and even the extinguishing of a secondary plasma, can be prevented by configuring components in ionized physical deposition processes to affect the electromagnetic fields in the region occupied by the secondary plasma to optimize retention of the charged particles in the plasma.

The present invention is further predicated in part upon a principle that a substantial loss of positive ions from a secondary plasma and a resulting reduction in the ionization fraction of sputtered ions by the secondary plasma, and even the extinguishing of a secondary plasma, are prevented when electrically conductive shields employed in ionized physical deposition processes on the periphery of the secondary plasma used for the ionization of the sputtered material are prevented from developing a substantial negative DC potential. The invention is further predicated in part upon the concept that the existence of conductive shields or chamber walls bounding the secondary plasma, if prevented from developing a strongly negative DC potential or if kept far from the center of the chamber, will reduce the steering of positive ions from the secondary plasma into the walls or shields, and decrease the width of the plasma sheath. The invention is particularly predicated on the concept of providing these effects while maintaining an RF shield that will allow effective and efficient coupling of energy into the secondary plasma.

According to certain principles of the present invention, an ionized physical vapor deposition (IPVD) method and apparatus are provided utilizing a target energized with a DC or pulsed DC source to energize a main plasma adjacent to a sputtering target and an RF reactively coupled source to energize a secondary plasma in the space between the target and a substrate oriented preferably parallel to the target at the opposite end of a sputtering chamber. The space in which the secondary plasma is generated is bounded by electrically conductive structure that is electrically floating and presents a high impedance to the RF source. This structure is further connected through a low pass filter which provides a low impedance DC path to ground or to some other potential.

In accordance with a preferred embodiment of the invention, an IPVD method and apparatus employs a direct current (DC) rotating magnetron cathode that includes a rotating magnet assembly positioned behind a target to produce a main sputtering plasma close to the surface of the target. The target is situated at one end of a deposition chamber opposite a substrate support parallel to the target at the other end of the chamber and preferably centered on the axis of the target and chamber. A radio frequency source is inductively coupled into the volume within the chamber between the target and the substrate, to produce an inductively coupled plasma (ICP) preferably in the volume between the main plasma and a substrate mounted on the substrate support. The lateral boundaries of the ICP are defined by the walls of the chamber and a quartz dielectric window or barrier behind which is positioned a coil that encircles the volume within the chamber to couple energy into the volume of the chamber to support the secondary plasma. Preferably, the window is sealed in an opening in the wall and constitutes part of the vacuum containment structure of the chamber, with the coil situated in an atmospheric pressure environment outside of the vacuum environment of the chamber. A metal shield positioned inside of the window shields the window from the deposition of conductive sputtered material thereon which, if permitted to accumulate on the window, would isolate the chamber from the coil. The properties of the magnet producing the magnetron magnetic field, or MMF, are also useful where the coil is situated inside of the chamber and energy is at least in part capacitively coupled into the secondary plasma.

The shield is electrically floating with respect to the RF plasma, presenting a high impedance to the RF plasma. A low pass filter, for example in the form of an LC circuit, is connected between the shield and either ground or some other predetermined fixed or otherwise controlled potential to present a low DC impedance to the shield while maintaining high impedance to the RF energy of the plasma. Preferably also, the shield is situated radially outwardly from the rim of the target, preferably by a distance of one to two inches. As a result, negative potential is prevented from accumulating on a surface close to the volume of the chamber, between the target and the substrate, where it is desirable to maintain the secondary plasma. Preventing the formation of the DC potential from accumulating on the surface will decrease the length of the near sheath or pre-sheath and raise the plasma potential of the secondary plasma. Decreasing the pre-sheath and increasing the potential difference between the secondary plasma and the substrate will lead to an increase in the ion density bombarding the substrate.

The present invention maintains a dense secondary plasma, which may have an ion density of, for example, 1000 times that of a typical sputtering plasma, and which occupies the volume between the target and the substrate, enabling the secondary plasma to produce a high ionization fraction of the sputtered material passing from the target to the substrate. The application of electrical or magnetic fields applies forces to the charged particles to enable them to be electrically steered toward the substrate. In particular, establishing a bias potential on the substrate increases the component of the direction of the ionized sputtered material at angles normal to the substrate surface, providing superior coating of the bottoms of high aspect ratio features on the substrate.

With the present invention, high aspect ratio holes can be effectively filled and contacts at the bottoms of such features can be more effectively coated.

These and other objectives and advantages of the present invention will be more readily apparent from the following detailed description of the preferred embodiments of the invention, in which:

DETAILED DESCRIPTION OF THE PREFERRED EMBODIMENT

Figure 1:
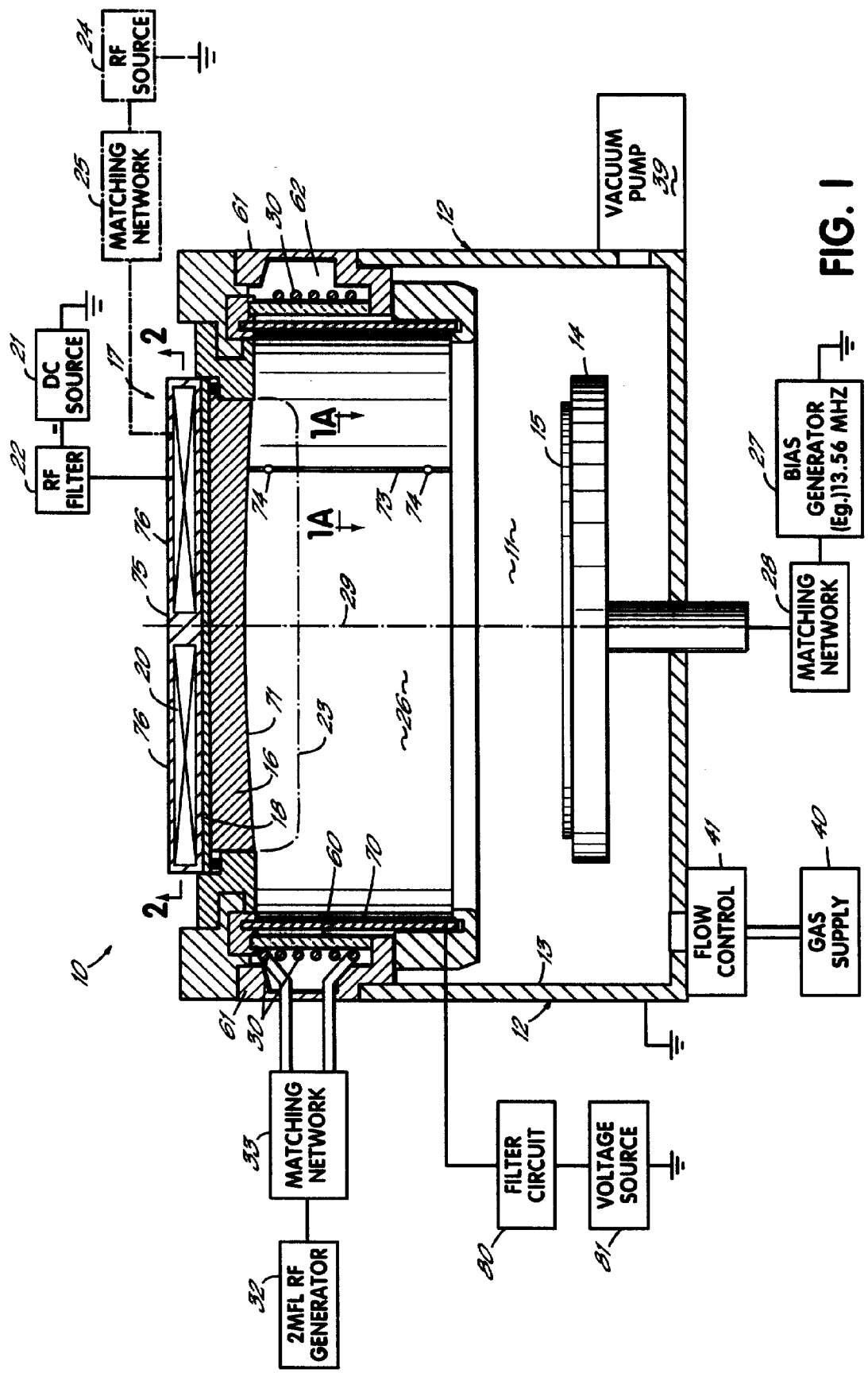
FIG. 1 is an elevational diagrammatic representation of a IPVD apparatus according to certain embodiments of the present invention.

FIG. 1 diagrammatically illustrates a sputter coating apparatus 10 embodying principles of the present invention. The apparatus 10 includes a vacuum tight chamber 12 bounded by a chamber wall 13. Within the chamber 12 is a plasma processing space 11. Mounted in the chamber 12 at one end thereof is a wafer support or susceptor 14 for supporting a semiconductor wafer 15 mounted thereon for processing by the application of a coating or film in an ionized physical vapor deposition process. The wafer 15, when mounted on the support 14, is parallel to and faces a target 16 mounted to, and which is part of, a cathode assembly 17 mounted in the chamber 12 and at the opposite end of the chamber 12 from the substrate holder 14. The target 16 may include a target backing plate 18 to which the target 16 is secured The cathode assembly 17 includes magnet structure in the form of a magnet assembly 20 which is typically provided behind the target 16 on the opposite side thereof from the space 11. A dark space shield (not shown) may also be provided around the periphery of the target 16. The chamber 12, target 16 and substrate support 14 are aligned on a common axis 29.

The magnet structure 20 preferably includes magnets that produce a closed magnetic tunnel over the surface of the target 16 that traps electrons given off into the chamber 12 by the cathode assembly 17 when the cathode assembly 17 is electrically energized to a negative potential as is familiar to one skilled in the art. The magnet structure, magnet assembly or magnet pack 20 may include fixed magnets or rotating or otherwise moving magnets, which may be permanent or electromagnets, and other features of any one of a number of magnetron sputtering assemblies known in the art, consistent with the description herein.

A target power supply or source 21 provides electrical energy to the target 16. The target power supply 21 is usually a source of constant or pulsed DC power and is connected between the cathode assembly 17 and some element such as the chamber wall 13 which is at ground potential and serves as the system anode. The cathode assembly 17 is insulated from the wall of the chamber 12. The power supply 21 preferably is connected to the cathode assembly 17 through an RF filter 22. An alternative source of energy such as an RF generator 24 may be optionally connected to the cathode assembly 17 through a matching network 25. A bias circuit 27 is also provided and connected to the substrate holder 14 through a matching network 28. The bias circuit 27 applies a bias potential to a wafer 15 mounted on the holder 14. A bipolar DC supply or an RF supply can be used for this purpose.

Power from the steady or pulsed DC power supply 21 and/or RF generator 24 produces a negative potential on the target 16. The negative potential accelerates ions toward the surface of the target which, upon impact, cause electrons to be emitted from the surface of the target 16. These electrons become trapped over the surface of the target 16 by the magnetic field generated by the magnet pack 20, until, eventually, the electrons strike and thereby ionize atoms of process gas in close proximity to the surface of the target 16, forming a main plasma in a region 23 of the volume 11 adjacent to the surface of the target 16. This main plasma in the region 23 becomes a source of positive ions of gas that are accelerated toward, and collide against, the negatively charged surface of the target 16, thereby ejecting particles of coating material from the target 16.

The space 11 between the surface of the target 16 and the substrate support 14 can be considered as formed of two parts. One part 23 is primarily occupied by the main plasma, which is shaped by the magnet assembly 20 to produce a desired erosion pattern on the sputtering surface of the target 16, while the second part of the space 11 is a remaining volume 26 that lies between the main plasma region 23 and the substrate 15 on the support 14. The particles of sputtered material from the target 16 generally leave the surface of the target 16 as electrically neutral particles that propagate by momentum only through the space 11. In a conventional sputtering apparatus, neutral sputtered particles passing through the main plasma region 23 are not ionized significantly since the main plasma is not relatively dense, occupies a relatively small volume near the surface of the target 16 and, at the low operating pressures employed in sputtering, few collisions occur between the neutral sputtered particles and particles of the main plasma. As such, the sputtered particles exit the main plasma region 23 mostly neutral and, in conventional sputtering, these particles would remain neutral when deposited as a thin film on substrate 15.

For some sputtering processes, such as those used for coating contacts at the bottoms of high aspect ratio holes and other features on the substrate 15 and for metallizing such holes by filling them with sputtered conductive material, it is highly preferred in VLSI semiconductor device manufacturing that the particles impinge onto the substrate 15 in a narrow angular distribution around the normal to the substrate so that they can proceed directly into the features and onto the feature bottoms without striking or being shadowed by the feature sides. This perpendicular impingement of particles on the substrate 15 is, in the apparatus 10, facilitated by ionizing the sputtered particles as they pass through the volume 26, so that the particles develop a positive electrical charge. Once positively charged, the sputtered particles can be electrostatically accelerated or otherwise electrically or magnetically directed into paths that are parallel to the axis 29 of the chamber 12 and perpendicular to the surface of the substrate 15. Such attraction of the positive ions of sputtered material toward the substrate 15 can be achieved, for example, by applying a negative bias to the substrate 15 through the operation of the bias power supply 27. Such bias attracts the positive sputtered ions, increasing the directionality of the ionized sputtered particles toward the substrate 15 by producing an electrical potential gradient in the plasma sheath in front of substrate holder 14, which provides the force to accelerate the positively ionized sputtered particles toward and onto the substrate surface. For silicon semiconductor wafers, this bias power supply 27 is preferably an RF generator that operates in the range of from about 0.05 to 80 MHz. Such a process of utilizing forces available by ionizing the sputtered particles is characteristic of the processes referred to as ionized physical vapor deposition (IPVD) or ion assisted sputter coating.

The in-flight ionization of sputtered particles as they pass through the space 11 is carried out creating a secondary plasma in the volume 26. There are several ways known in the prior art for generating such a plasma. In the apparatus 10, this plasma is preferably generated by inductively coupling RF energy into the volume 26 from an RF coil 30 that surrounds the volume 26 and preferably lies outside of the vacuum chamber 12. The coil 30 surrounds the chamber 12 and is centered on an axis that corresponds to the axis 29 of the chamber 12. The coil 30 is preferably in the form of a helical coil, though coil configurations other than helical may be used. The RF energy may be fed into the coil 30 by leads connected across the ends of the coil, as shown in FIG. 1, by adding a center RF tap to the center of the coil and grounding the other two leads or vice versa. The coil 30 inductively couples energy into process gas in the volume 26, forming a dense plasma that generally fills the space 26. An RF generator 32, preferably operative at a frequency of approximately 2 MHz, is connected to the coil 30 through a matching network 33 to provide the energy to the coil 30 to form the plasma in the volume 26.

A source of processing gas 40 is connected to the chamber 11, through a flow control device 41. For sputter processing, the gas from the supply 40 is typically an inert gas such as argon. For reactive processes, additional gases, such as nitrogen, hydrogen, ammonia, oxygen or other gas, can be introduced through auxiliary flow controllers. A high vacuum pump 39 is also connected to the chamber 12 to pump the chamber to a vacuum in $10^{-9}$ to $10^{-8}$ Torr range, and maintain a vacuum in the mili-Torr range during deposition. For most processes, pressures in the 1 to 50 milli-Torr range are typically preferred. The pump 39 may by baffled, for example, to maintain process pressure of 0.5 to 40 mTorr using gas flows of, for example, 1–500 standard cubic centimeters per second (sccm).

In the wall of the chamber 12, between the coil 30 and the space 11 there is provided a dielectric window 60. The window 60 is formed of a vacuum compatible dielectric material such as quartz or other material that does not impede the magnetic field surrounding the coil 30 from reaching into the volume 26. The window 60 is mounted to form a vacuum tight seal with the wall of the chamber 12, allowing the coil 30 to lie in an annular cavity 62 at atmospheric pressure on the outside of the window 60. The window 60 is preferably a single cylindrical piece of the electrically insulating and magnetically-transparent material, but it may be formed of joined segments of material arranged to form a generally cylindrical protective structure in the form of electrically insulating windows in an enclosing structure. A conductive metal outer closure 61 forms the outer wall of the sealed annular cavity 62 which electrically isolates the coil 30 from the outside environment and prevents electromagnetic energy from radiating from the coil 30 and from within the chamber 12 to the outside of the chamber 12. The space within the closure 61 may be in communication with the outside atmosphere or may be filled with inert gas, at atmospheric or low pressure, provided that formation of a plasma is not supported by the gas in the cavity 62 when the coil 30 is energized. The space may also include facilities for cooling the shield 70.

While the window 60 itself is not electrically conductive, it is susceptible to the accumulation of a coating of conductive material sputtered from the target 16. Electrical conductivity in or on the window 60 supports the induction of azimuthal currents around the chamber which reduce, cancel or otherwise undermine the effectiveness of the RF coupling of energy from the coil 30 to the secondary plasma in the volume 26. Such conductivity on the window 60, particularly in the azimuthal (circumferential) direction, that is, a direction that extends around the axis 29 of the chamber 12 produces an inductively coupled short circuit for electron currents, which can negate all or much of the energy being inductively coupled into the volume 26.

Figure 1A:
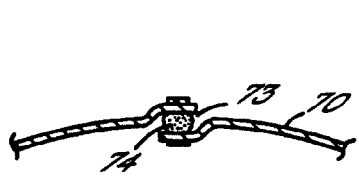
FIG. 1A is a partial cross sectional view taken along the line 1A—1A of FIG. 1.

To prevent such buildup of conductive sputtered material on the window 60, a shield 70 is provided in the vacuum of the chamber 12 between the space 11 and the window 60, in close proximity to the inside surface of the window 60. The shield 70 is preferably generally cylindrical in shape. The shield 70 shadows the window 60 from material sputtered from the target 16, and preferably blocks all direct line-of-sight paths between any point on the surface of the target 16 and the window 60. The shield 70, like the window 60, must not, itself, provide an electrically conductive circumferential short circuit when it is placed in the chamber 12. To this end, the shield 70 is provided with a longitudinal slit 73 that is parallel to the axis 29 of the chamber 12. The slit 73 interrupts circumferential current paths around the axis 29. Shields with a single slit or with a plurality of slits, fashioned to interrupt currents such as circumferential currents and eddy currents in the shield, can alternatively be used, or the shield may be formed as a segmented shield or a shield array. The single slit 73 in a shield of an otherwise generally cylindrical shape is a suitable embodiment of the shield 70 which substantially interrupts circumferential paths in the shield 70 around the chamber 12 to prevent the induction of circumferential or azimuthal currents in the shield 70. The edges of the shield 70 adjacent the slit 73 preferably overlap so that, while interrupting circumferential current paths around the chamber 12, the slit 73 does not permit the passage of sputtered particles propagating in straight paths from the space 11 onto the window 60. The width of the slit 73 is maintained by a pair of dielectric beads or spacers 74 between the opposite edges of the shield 70 adjacent the slit 73, as illustrated in FIG. 1A. In the case of a plurality of slits, the slits preferably extend above and below the coil turns and have approximately the same pitch as the orthogonal coil pitch.

The shield 70 also preferably has an axial extent beyond the axial extent of the coil 30 that reaches substantially the full effective axial extent of the field from the coil 30. As a result, the electrically conductive shield 70 effectively suppresses electric fields in the RF plasma that are parallel to the axis of the chamber 12, preventing such axial electric fields that would capacitively shield the coil 30 from the volume 26 which would in turn undermine the coupling efficiency of energy to the volume 26 from the coil 30. It is preferred that the shield 70 extend axially from behind the plane of the surface of the target 16 to beyond the window 60 and coil 30.

The shield 70 is maintained at a distance from the window 60 that is preferably not more than the mean free path of atoms or molecules in the gas or the minimum diffusion length of the plasma within the chamber 12. In the apparatus 10, it is contemplated that processing gas pressures in the range of about 5 to 50 milli-Torr will be used. The mean free path of argon gas at such pressures is from 11 mm to 1.0 mm, respectively. As a result, the preferred spacing of the shield 70 from the window 60 is approximately 1–3 mm.

Alternative details of the IPVD apparatus 10 are set forth in the copending and commonly assigned U.S. Pat. No. 5,800,688 and U.S. patent applications Ser. No. 08/844,756 pending and Ser. No. 08/844,757 now U.S. Pat. No. 5,948,215, all filed on Apr. 21, 1997, hereby expressly incorporated by reference herein.

In the apparatus 10, the effectiveness of the ionization of the sputtered particles in achieving the desired directionality of the coating material arriving at the substrate 15 is dependent on the ion fraction, or the percentage of the sputtered particles that are ionized passing through the secondary plasma in the volume 26. A higher ion fraction enables a higher flux of positive ions onto the substrate 15 and provides more directionality to the deposition. The amount of power required by the bias power supply 27 to maintain a constant potential on the substrate 15 and substrate holder 14 is a direct indicator of the ion flux onto the substrate 15.

The rate at which electrons stray from the secondary plasma directly affects the effectiveness of the secondary plasma to produce a high ion fraction of sputtered material arriving at the substrate 15. The coil 30, or other secondary plasma energization source, can be designed to optimize retention of electrons in the secondary plasma.

Electrons are lost from the secondary plasma either into the chamber walls 13, shield 70 or other structure bounding the secondary plasma, or into the main plasma that is trapped in the space 23 by the cathode magnet assembly 20. A measure of the loss of electrons into the main plasma 20 can be made by measuring the current collected by the target 16 during operation of the ICP only, that is, with the coil 30 energized by the power supply 32, with the target power supply 21 turned off, but with the magnets of the magnet assembly 20 in place. With a rotating cathode magnet assembly, the measurement is made with the magnet assembly rotating to produce the same magnetron magnetic field that will be used during sputtering of the target. The current measured at the target 16 under these conditions is that due to ions produced by the remaining electrons in the secondary plasma. Higher currents indicate a larger number of electrons in the secondary plasma.

The preferred cathode magnet assembly 20 produces a magnetron magnetic field that is confined to the vicinity of the target 16. The MMF does not penetrate with sufficient strength significantly into the volume 26 of the chamber 12 to effectively couple the field of the coil 30 from that of the cathode magnet assembly 20. The combined strength and extent of the magnetron magnetic field thereby effectively decouples the main plasma from the secondary plasma. Preferably, the magnet assembly 20 of which all of the magnets thereof that substantially contribute the overall field of the assembly 20 have their north-south polar axes oriented substantially perpendicular to the axis 29 of the chamber 12 and the coil 30. One preferred magnet assembly is that described in U.S. Pat. No. 5,130,005, hereby expressly incorporated by reference herein. Preferably, a ribbon magnet of the type described in this patent is employed and without auxiliary magnets inclined at significant angles to the plane of rotation of the assembly, as illustrated in FIG. 2.

Figure 2:
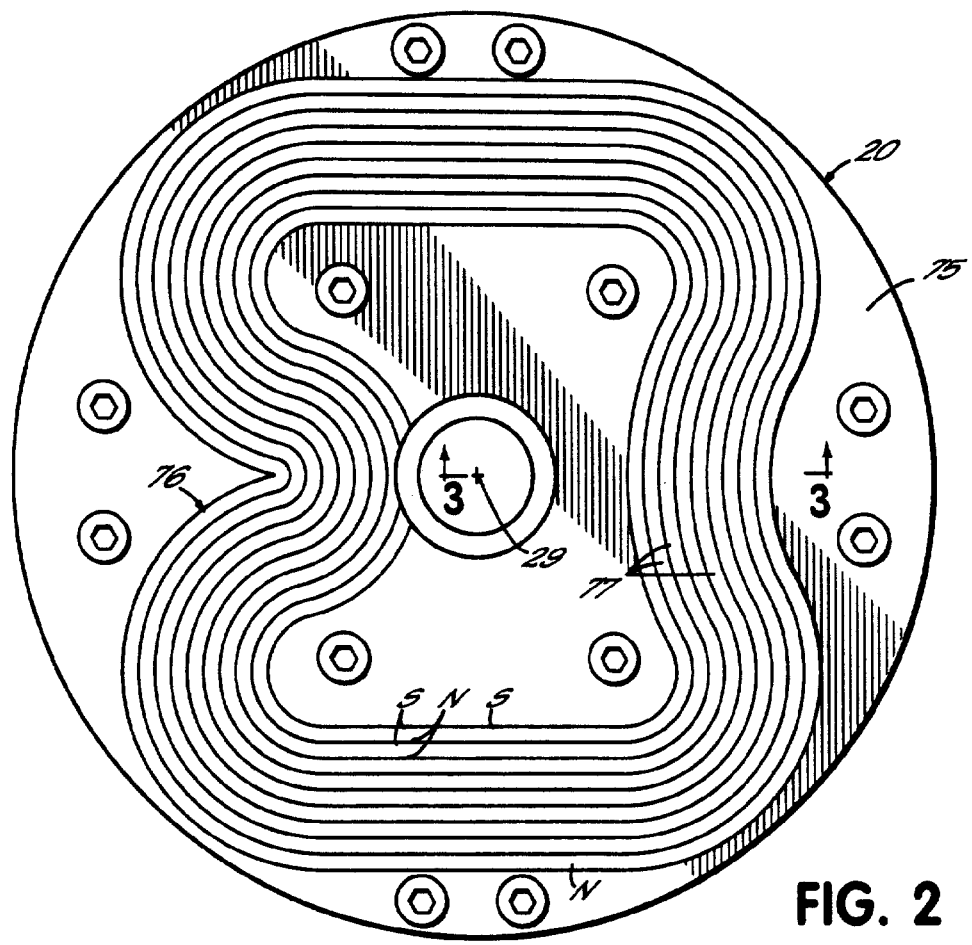
FIG. 2 is a cross-sectional view of a magnetron magnet assembly taken along the line 2—2 of FIG. 1.
Figure 3:
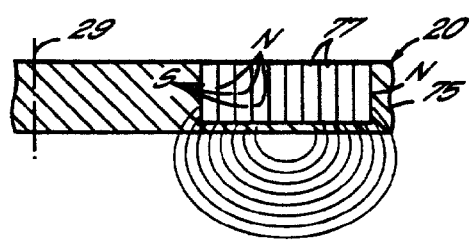
FIG. 3 is a cross-sectional diagram taken along the line 3—3 of FIG. 2 depicting the magnetic field shape of the magnetron magnet assembly of the apparatus of FIG. 2.

As shown in FIG. 2, the magnet assembly 20 includes a rotatable carrier 75 which rotates about the axis 29 and which has a continuous ribbon magnet 76 arranged thereon in a closed loop. The ribbon magnet 76 is formed of a plurality of layers 77, each having a lateral side that is the north pole of the layer and on the opposite side that is the south pole of the ribbon, thereby producing a composite ribbon magnet 76 having its N-S polar axis lying in a plane that is perpendicular to the axis 29. The magnet 76 can be formed of one or more individual bar magnets, electromagnets or other forms of magnets having polar axes generally parallel to the plane of rotation of the carrier 75. Other magnet structures that produce field lines that tend to flatten along the plane of the surface of the target 16, or that otherwise do not extend with any great strength into the volume 26, may also be employed alternatively or in addition to the magnets illustrated. FIG. 3 diagrammatically illustrates the magnetic field produced by the magnet 76 of the preferred magnet assembly.

Retention of positive ions in the region of the secondary plasma close to the shield 70 is enhanced by provision of a filter circuit 80 connected between the shield 70 and a voltage control circuit 81 that maintains a controlled voltage level, and in one embodiment is merely a ground connection. The filter circuit 80 prevents a negative DC potential from building up on the shield 70 due to the accumulation of electrons from the secondary plasma, a certain degree of which is difficult to avoid. Significant negative DC potential on the shield attracts positive ions from the sheath or near sheath region of the secondary plasma, which may decrease the density of ions in the secondary plasma. Such negative DC potential also changes the fields in the chamber which can affect ion paths in the chamber and can increase plasma potential which increases plasma to wafer voltage drop. The filter circuit 80 allows the shield 70 to float with respect to the RF frequency of the energy being coupled from the coil 30 to the secondary plasma.

The filter circuit 80 is essentially a low pass filter configured to present a low DC impedance to the control voltage level, thereby fixing the average potential of the shield 70 at ground potential or at some other potential that is not substantially negative relative to the plasma potential. The filter 80 presents a high impedance to potentials coupled from RF of the coil 30, which avoids producing a electrical shielding effect with the coil 30 that would reduce coupling of the RF energy from the coil 30 into the secondary plasma.

Figure 4:
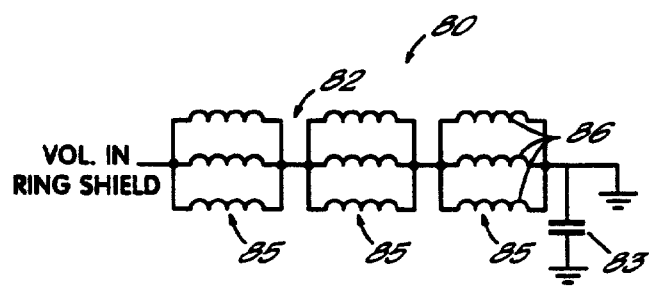
FIG. 4 is a circuit diagram of one embodiment of a filter circuit of the apparatus of FIG. 1.

The filter circuit 80, which is diagrammatically illustrated in FIG. 4, is an LC circuit that includes an inductor 82. It has been effective when configured to have a total net inductance of 20 mH (milli-Henries) connected in series between the shield 70 and the voltage maintenance circuit 81. A 0.1 $\mu$F (microfarad), 800V capacitor 83 is connected in parallel across the voltage source 81 and ground. In one example, a filter 80 was used that produced an impedance of about 250,000 Ohms to the 2 MHz RF energy on the shield 70. In this example, the inductor 82 was formed of three series connected sets 85 of three parallel 20 mH coils 86 rated at 2 amps each. This produces a coil 82 having heat dissipation capability for handling about 18 amperes of DC current. It is preferred that the filter 80 present an overall impedance of 500 kOhms, and preferably 750 kOhms to the frequency of the RF generator or source 24. The selection of such values will vary with the choice of frequency of the RF power on the coil as well as with choices of other design parameters.

The measured power required to maintain the bias voltage on the substrate 15, which is an indication of the ion flux onto the substrate 15, is set forth in Table 1 as follows:

TABLE 1

| DC Target Power (kWatts) | Substrate Power (without filter; Watts) | Substrate Power (with filter; Watts) |
|---|---|---|
| 1 | 39 | 82 |
| 2 | 34 | 67 |
| 2.5 | 33 | 63 |
| 3 | 32 | 59 |
| 4 | 29.5 | 53 |
| 5 | 28.5 | 48 |
| 6 | 27.5 | 42 |

This data also show that, with increased target power and thus increased amounts of sputtered material, the fractional ionization of the material onto the substrate 15 declines. This data was produced using preliminary operating process parameters that included: 2.2 kWatts of power at a frequency of 2 MHz on the shield 70, producing an approximate peak-to-peak voltage of 640 volts; with a pressure in the chamber 12 of 11 mTorr; a 10 inch target; and the chamber dimensions as set forth above. With the filter 80, the DC potential on the shield 70 was essentially at ground, which was the setting of the voltage control source 81. Without the filter 80, potential on the shield 70 was about −60 volts with the target power in the range of from 1.8 to 2.5 kWatts. As a result of the increased plasma density, the percentage of bottom fill of high aspect ratio features on the substrate 15 (e.g., 0.39 microns wide, 0.9 microns high, i.e., aspect ratio of 2.3) changed from about 50–55% without the filter 80 to about 85–90% with the filter 80.

Further, it was observed that when the inductance of the inductor 82 of filter 80 is below 10 mH, interaction of the 2 MHz energy on the shield 70 with ground potential, for example, decreases the ion density of the material incident onto the substrate 15 to an ineffective level.

Advantages of the present invention have been demonstrated by measuring plasma properties, such as plasma potential, ion density, and electron temperature, using a langmuir probe using a 1.8 kW DC magnetron process. The filter 80 produced an increase of ion density arriving at the substrate 15 by a factor of approximately 3. This is attributed to a decrease of DC potential on the shield, which is believed to cause a deduction in the affinity for ion attraction to the shield and an increase of ion attraction to the substrate resulting in a higher number of ions, both metal and argon, arriving at the substrate. The addition of the filter 80 resulted in an increase in plasma potential from 24 volts without the filter to 39 volts with the addition of the filter. Decrease in the plasma induced DC potential on the shield resulted in the increase in plasma potential, and also the potential difference between the plasma and the substrate. Since the substrate forward power is proportional to both the ion density and the potential difference between the plasma and the substrate, the number of ions striking the substrate is higher. Electron temperature was about 2 electron volts and did not change substantially with the addition of the filter 80 with magnetron power at 1.8 kW, but with lower magnetron powers of less than 1 kW addition of the filter 80 was noted to increase electron temperature by about 1 eV. This is believed to be due to the plasma potential at the sheath-presheath interface being equal to half the electron temperature. By decreasing the presheath perturbation, this potential increases since the presheath potential is believed to be comparable to bulk plasma potential under these conditions. This mechanism is significant at lower powers. At higher powers, the effect is less significant as the atomic flux and interaction between the primary magnetron plasma and secondary plasma become more significant.

Those skilled in the art will appreciate that the implementation of the present invention herein can be varied, and that the invention is described in preferred embodiments. Accordingly, additions and modifications can be made without departing from the principles and intentions of the invention.

What is claimed is:

1. An ionized physical vapor deposition apparatus comprising:

a sealable vacuum chamber having a volume therein for containing a processing gas at a vacuum pressure level;

a sputtering cathode in the chamber at an end of the volume, the cathode including a target support for holding a sputtering target thereon facing the volume of the chamber;

a cathode power source connected to the sputtering cathode for energizing the cathode;

a substrate support in the chamber at an end of the volume opposite the target support for supporting thereon, facing the target across the volume, a substrate to be coated with material sputtered from a target supported on the target support;

an RF energy source having an RF frequency and coupled into the volume to energize a secondary RF plasma in the gas therein of sufficient density to ionize sputtered material moving from the target through the volume, the RF energy source including at least one coil surrounding the volume of the chamber between the substrate support and the target support to inductively couple RF energy into the volume to energize the secondary plasma;

electrically conductive shield structure extending around the chamber between the coil and the volume having a potential thereon that electrically floats at the RF frequency of the RF energy source with the potential of the plasma, the shield structure being configured and positioned to intercept sputtered material moving radially outwardly from the volume, the shield structure having at least one axial discontinuity therein sufficient to interrupt conductive paths in the shield structure from extending circumferentially around the chamber so that the coil passes RF energy therethrough from the coil into the volume; and a filter, connected between the shield and a voltage control circuit, having a high impedance at the frequency of the RF source and having a low DC impedance such that, when energy from the cathode power source produces a main plasma in the gas in the chamber which sputters material from a target on the target support and into the volume, and a secondary plasma is formed in the volume by energy inductively coupled from the RF energy source, negative charge arriving on the shield structure is conducted to the voltage control circuit while the shield structure electrically floats at the RF frequency with the plasma so that the plasma sheath between the plasma and the shield structure is narrow and the plasma sufficiently fills the volume to effectively ionize the sputtered material moving from the target through the volume so that it is steerable toward and normal to a substrate on the substrate support.

2. The apparatus of claim 1 wherein:

the cathode power supply is a constant or pulsed DC power supply and the filter is low pass with low impedance to DC.

3. The apparatus of claim 1 wherein:

the voltage control circuit connects the filter to ground potential.

4. The apparatus of claim 1 wherein:

the filter is an LC filter.

5. The apparatus of claim 1 wherein:

the filter has an impedance of approximately ¼ megohm at the RF frequency of the RF source.

6. The apparatus of claim 1 wherein:

the chamber has a wall with an opening therein;

the apparatus further comprises a dielectric window sealed to the wall around the opening to isolate the gas at the vacuum pressure level in the volume within the chamber; and the at least one coil being outside of the chamber behind the window and isolated by the window from contact with the gas in the volume; and the shield structure encircles the chamber inside of the window and in close proximity thereto and extends axially sufficiently far to shadow the window from sputtered material.

7. The apparatus of claim 1 further comprising:

a bias potential generator connected to the support to electrically bias a substrate on the support to accelerate ions of the sputtered material in a direction normal to the substrate.

8. The apparatus of claim 1 wherein:

the at least one axial discontinuity in the shield structure is in the form of at least one axial slit formed between two radially spaced and circumferentially overlapping edges of the shield structure.

9. A method of ionized physical vapor deposition comprising the steps of:

providing a sealable vacuum chamber having a volume therein for containing a processing gas at a vacuum pressure level, a target support in the chamber at an end of the volume, and a substrate support at an end of the volume opposite the target support for supporting thereon, facing the target support across the volume, a substrate to be coated with material sputtered from a target supported on the target support;

sputtering material into the volume from a target mounted in the target support by energizing the target on the target support;

inductively coupling RF energy, at an RF frequency, from an RF source into the volume and energizing with the coupled RF energy a secondary RF plasma in gas in the volume, and with the secondary RF plasma ionizing sputtered material moving from the target in the volume; and while performing the sputtering and coupling steps, maintaining shield structure between the RF source and the volume that has a potential that floats at the RF frequency of the RF energy by providing a low impedance DC path to a controlled potential from the shield structure and a high impedance to energy at the frequency of the RF source to maintain a narrow plasma sheath between the RF plasma and the shield.

10. The method of claim 9 further comprising the step of:

while performing the sputtering and coupling steps, providing an impedance of at least 250 k Ohms to energy at the frequency of the RF source that is present on the shield structure.

11. The method of claim 9 further comprising the step of:

while performing the sputtering and coupling steps, providing an impedance of at least 750 k Ohms to energy at the frequency of the RF source that is present on the shield structure.

12. The method of claim 9 wherein:

the RF energy coupling step includes the step of coupling RF energy from at least one coil surrounding the volume of the chamber between the substrate support and the target support and inductively coupling RF energy from the coil into the volume to energize the secondary plasma in the gas in the volume through an RF magnetic field in the volume.

13. The method of claim 12 wherein:

the RF energy coupling step includes the step of maintaining the coil behind a dielectric window sealed into a vacuum containing wall of the chamber and isolated by the window from contact with the gas in the volume.

14. The method of claim 9 further comprising the step of:

biasing a substrate on the support so as to attract toward the substrate positive ions of material sputtered from the target by a main plasma and ionized by the secondary plasma, thereby increasing angles of incidence of sputtered particles onto the substrate.

* * * * *